United States Patent [19]

Kingston

[11] Patent Number: 4,841,552
[45] Date of Patent: Jun. 20, 1989

[54] DIGITAL PHASE SHIFTER

[75] Inventor: Samuel C. Kingston, Salt Lake City, Utah

[73] Assignee: Unisys Corporation, Blue Bell, Pa.

[21] Appl. No.: 177,283

[22] Filed: Apr. 4, 1988

[51] Int. Cl.⁴ ..................... H03K 5/153; H03K 5/135
[52] U.S. Cl. ........................................ 377/43; 328/55; 307/512
[58] Field of Search .................... 377/43; 328/55, 155; 307/512

[56] References Cited

U.S. PATENT DOCUMENTS

| | | | |
|---|---|---|---|
| 3,517,323 | 6/1970 | Rudin | 307/512 |
| 4,431,969 | 2/1984 | Summers et al. | 328/155 |
| 4,649,553 | 3/1987 | Madni et al. | 377/43 |
| 4,675,612 | 6/1987 | Adams et al. | 328/55 |
| 4,700,347 | 10/1987 | Rettberg et al. | 328/55 |

Primary Examiner—John S. Heyman
Attorney, Agent, or Firm—John B. Sowell; Robert S. Bramson; Mark T. Starr

[57] ABSTRACT

A novel digital phase shifter is provided for accomplishing digital phase shifting without the requirement of complex multiplication. The phase shifter includes buffer registers for receiving and storing the inphase and quadrature components of a complex number and for storing in a phase command register the information indicative of the phase shift to be accomplished. The phase shifting apparatus comprises a command map for generating a plurality of plus or minus phase shift command bits. A plurality of plus or minus phase shift registers are coupled to the phase shift command bits for performing plus or minus phase shifts of predetermined angles that diminish by a factor of approximately one-half from the previous phase shift angle.

8 Claims, 4 Drawing Sheets

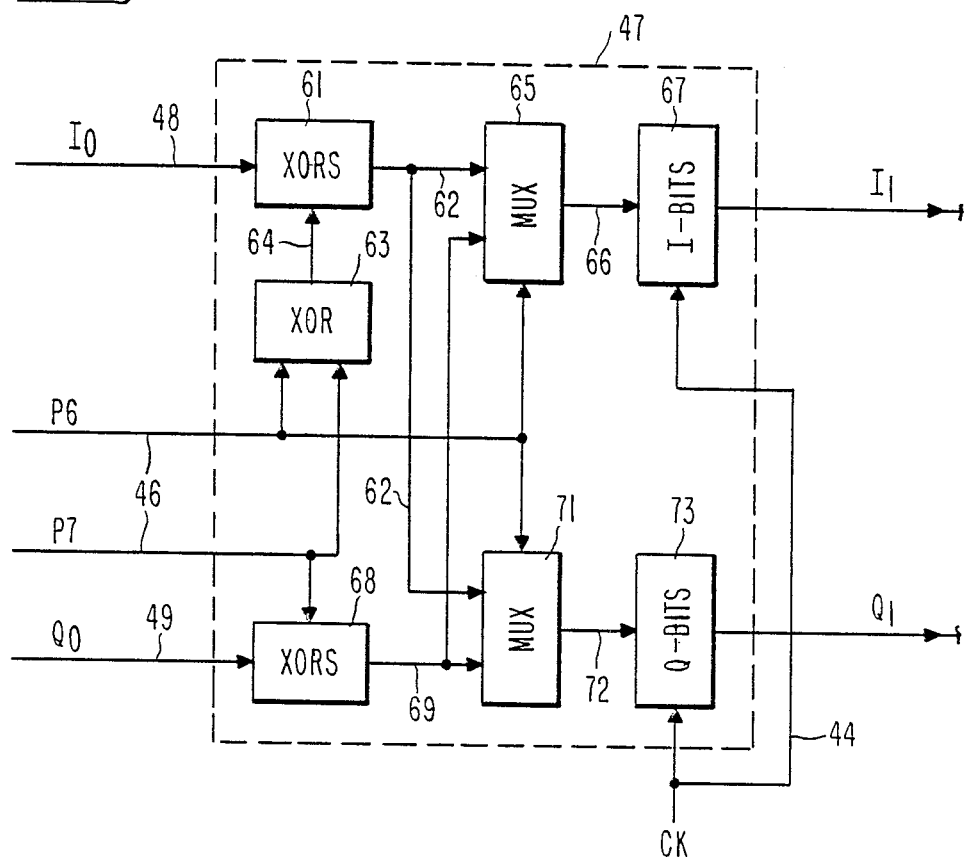

| S. BIT | I₂ | Q₂ |
|---|---|---|
| 0 | $I+Q(2^{-N})$ | $Q-I(2^{-N})$ |
| 1 | $I-Q(2^{-N})$ | $Q+I(2^{-N})$ |

DIGITAL PHASE SHIFTER

BACKGROUND OF THE INVENTION

1. Field of the Invention

The present invention relates to a novel apparatus for phase shifting complex samples of real and imaginary components. More particularly, the present invention relates to a high speed digital phase shifter for use in various forms of numerical digital processing where it is desired to rotate a vector through a predetermined phase angle.

2. Description of the Prior Art

Heretofore, apparatus for tracking incoming complex samples comprising real and imaginary components have been digitally phase shifted. The apparatus for accomplishing digital phase shifting has heretofore employed high speed digital processors that perform basically four multiplication steps. Phase shifting accomplished by multiplication may be accomplished by either an available processor or a dedicated multiplier.

It would be desirable to provide a novel digital phase shifter that is faster and cheaper than prior art multiplier devices.

SUMMARY OF THE INVENTION

It is a principal object of the present invention to provide a novel high speed phase shifter.

It is another principal object of the present invention to provide a novel phase shifter for use in phase modulation, phase demodulation and for tracking complex samples comprising real and imaginary components.

It is another object of the present invention to provide a novel phase shifter having fewer logic components.

It is another general object of the present invention to provide a high speed phase shifter for phase error compensation of complex base band signals.

It is yet another general object of the present invention to provide a phase shifter for coherently detecting digital signals without the requirement of look up tables and multipliers.

According to these and other objects of the present invention there is provided a digital phase shifter comprising a phase command register, a quadrature register and an inphase register for receiving a phase command and a complex number. A command mapping device is coupled to the phase command register for producing a plurality of plus or minus phase shift command bits. A quadrature shifter is coupled to the phase command register to provide selective quadrature phase shifting of the real and imaginary components of the complex number. A plurality of plus or minus phase shifters are arranged in series and coupled to the quadrature shifter and to the phase command map to perform sequential plus or minus phase shifts of predetermined angles of phase shift that diminish by a factor of approximately one-half from the previous phase shift angle.

BRIEF DESCRIPTION OF THE DRAWING

FIG. 4 is a detailed block diagram of a general purpose quadrature phase shifter of the type employed in FIG. 2;

FIG. 5 is a truth table for a quadrature phase shifter of the type shown in FIG. 4;

DESCRIPTION OF THE PREFERRED EMBODIMENT

Figure 1:
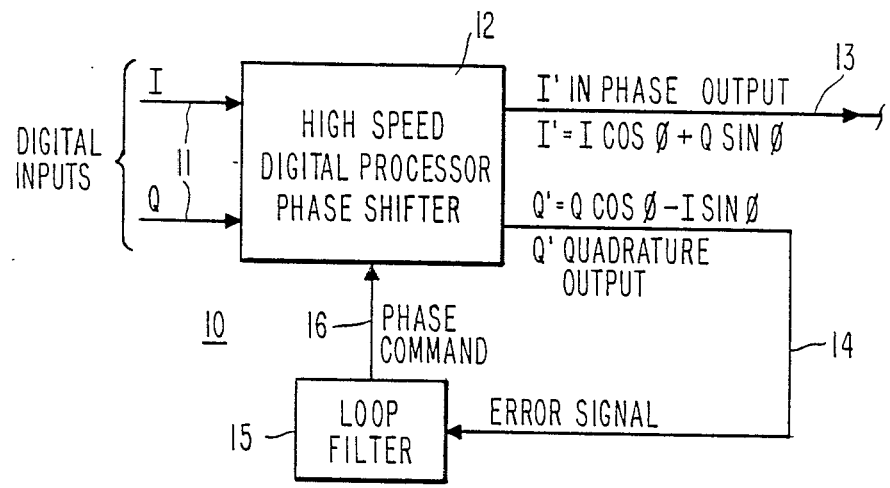
FIG. 1 is a block diagram showing a prior art digital tracking loop which employs a high speed processor as a digital phase shifter.

Refer now to FIG. 1 showing a prior art type tracking loop 10. The tracking loop 10 has an incoming signal on lines 11 which is a complex number comprising an inphase (I) and quadrature (Q) component. The complex number on lines 11 is applied to a high speed processor 12 which in this illustration is being used as a digital phase shifter. The digital processor 12 has trigonometric look up tables for the values of different angles or has a program which will generate cosine and sin trigonometric functions. The output of the digital processor on line 13 is the inphase or coherent output I' which is equal to I cos $\phi$ plus Q sin $\phi$. The output on line 14 is the quadrature output Q' which is equal to Q cos $\phi$ minus I sin $\phi$. The signal on line 14 is also a digital error signal which is applied to loop filter 15 to produce a digital phase command output on line 16 which is applied as a digital number to the digital processor 12 to shift the phase of the input complex number to cause the output on line 13 to track the input on lines 11. When the digital processer is employed to perform the phase shifter operation, the speed of operation is limited by the basic speed of the computer which employs at least four relatively complex multiplying steps as well as requiring a lookup table to fetch the trigonometric functions employed in the multiplication steps. If a dedicated multiplier is substituted for a general purpose digital processor the speed of operation can be increased, but the dedicated hardware still requires four complex multiplication steps ad lookup tables which have the trigonometric functions stored therein or the hardware is supplied for generating the trigonometric functions.

Figure 2:
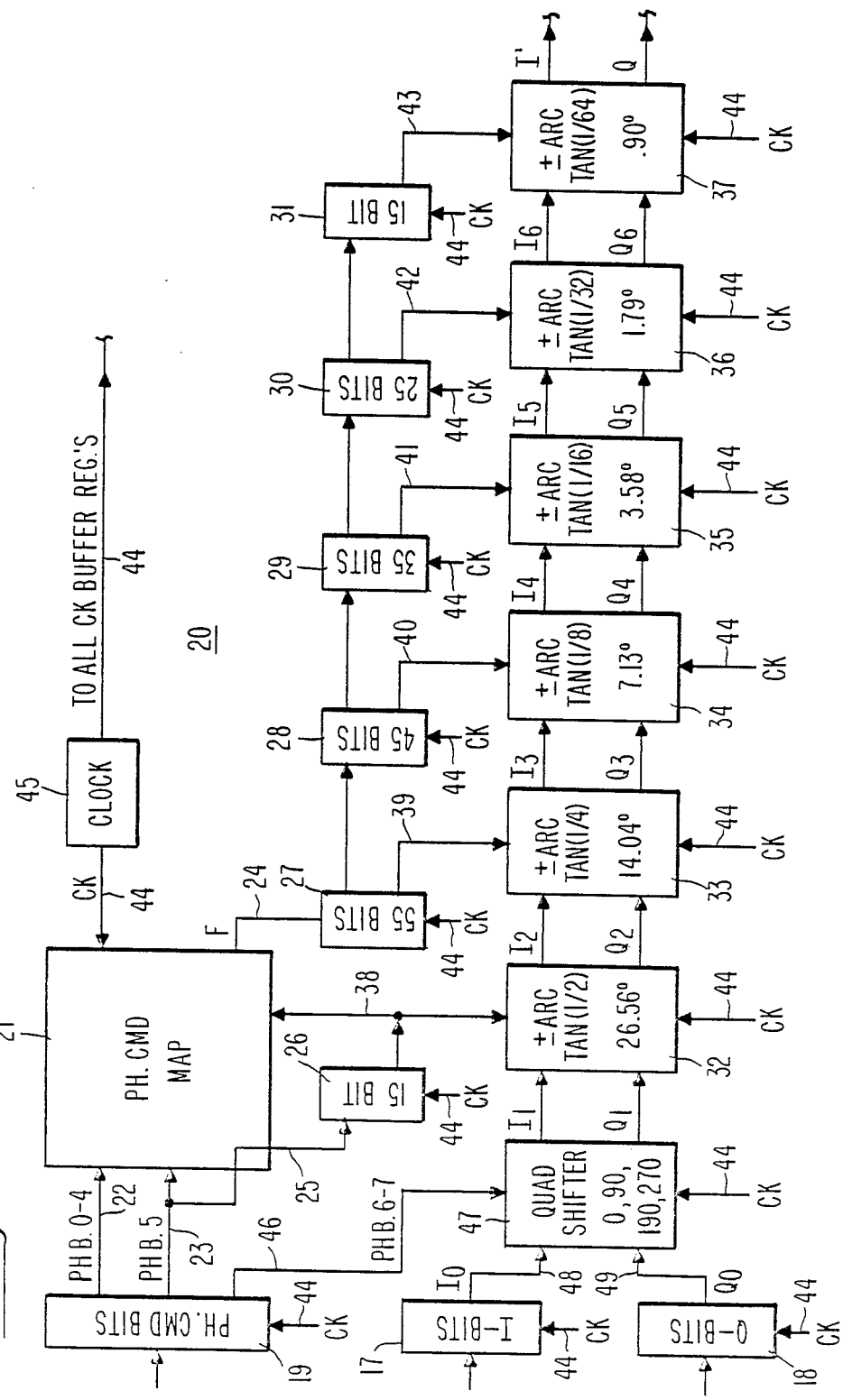
FIG. 2 is a block diagram of a preferred embodiment of the present invention digital phase shifter.

Refer now to FIG. 2 showing a preferred embodiment shift register 20 having an inphase register 17 and a quadrature register 18 for receiving and storing the real or inphase and the imaginary or quadrature complex numbers which represent a complex sample. In the preferred embodiment of the present invention a phase command register 19 is provided for receiving the phase command bits representative of the phase shift to be performed on the complex sample. If the present invention is used as a fixed phase shifter or rotator, the phase command bits in register 19 may be built into the phase command map 21. The phase command bits on line 22 and the phase command bits on line 23 are coupled to the input of the phase command map 21 to produce output signals on lines 24 and 25 which are sign bits stored in registers 26 through 31 which control the plus or minus phase of the plus or minus phase shifters 32 through 37 via lines 38 through 43 respectively. The loading and shifting of information into and out of the plus or minus phase shifters 32 through 37 is controlled by input clock pulses on lines 44 from clock 45. The phase command bits in register 19 provide two phase command bits on line 46 which are applied to a quadrature shifter 47 which is coupled to register 17 and 18 by lines 48 and 49 respectively. The command bits on line 46 are sufficient to instruct the quadrature shifter 47 to shift the incoming signals on lines 48 and 49 to one of four quadrature positions. The output from the quadrature shifter 47 is applied as a complex number to the first of a plurality of plus or minus phase shifters 32 each of which has a plus or minus control signal derived from the phase command map 21. The function performed in each of the phase shifters is a logic function performed in one logic clock time which can be performed by gating operation as will be explained in greater detail hereinafter. The function shown in phase shifter 32 is that the phase of the complex number $I_1+jQ_1$ will be phase shifted by a factor of 26.56° which is the arc tangent of one-half. Similarly, the phase shifter 33 will perform a plus or minus phase shift operation on the complex number $I_2+jQ_2$ which is applied to the input of phase shifter 33 to shift the phase of this complex number by 14.04° which is equal to the arc tangent of one-quarter. It will be noted that each sequential phase shifting step which is performed in the plus or minus phase shifter 34 through 37 phase shifts the incoming complex number $I_3+jQ_3$ etc. by a successive smaller phase shift angles which are approximately one-half the number of degrees of the previous phase shift and the shift is equal to exactly the arc tangent of $(\frac{1}{2})^N$ where N is equal to the number one at phase shifter 32 and N is equal to the number 6 at phase shifter 37. In the preferred embodiment of the present invention only six phase shifters 32 through 37 have been shown. It will be understood that there is no practical limitation to the number of phase shifters that may be employed with the present invention if the accuracy is needed. For example, if the number of bits in register 17 and 18 were much greater than the 8 bits illustrated, it would be desirable to extend the number of phase shifters and to extend the number of bits in the phase command register 19 which would cause an extension of the phase command map 21. For the preferred embodiment phase shifter shown in FIG. 2 the accuracy of the phase shift operation for the 8 bits stored in buffer register 17 and 18 is plus or minus 0.90° which could be halved by adding one additional plus or minus phase shifter or could be reduced to one-quarter of 0.9° by adding two additional phase shifters.

Figure 3:
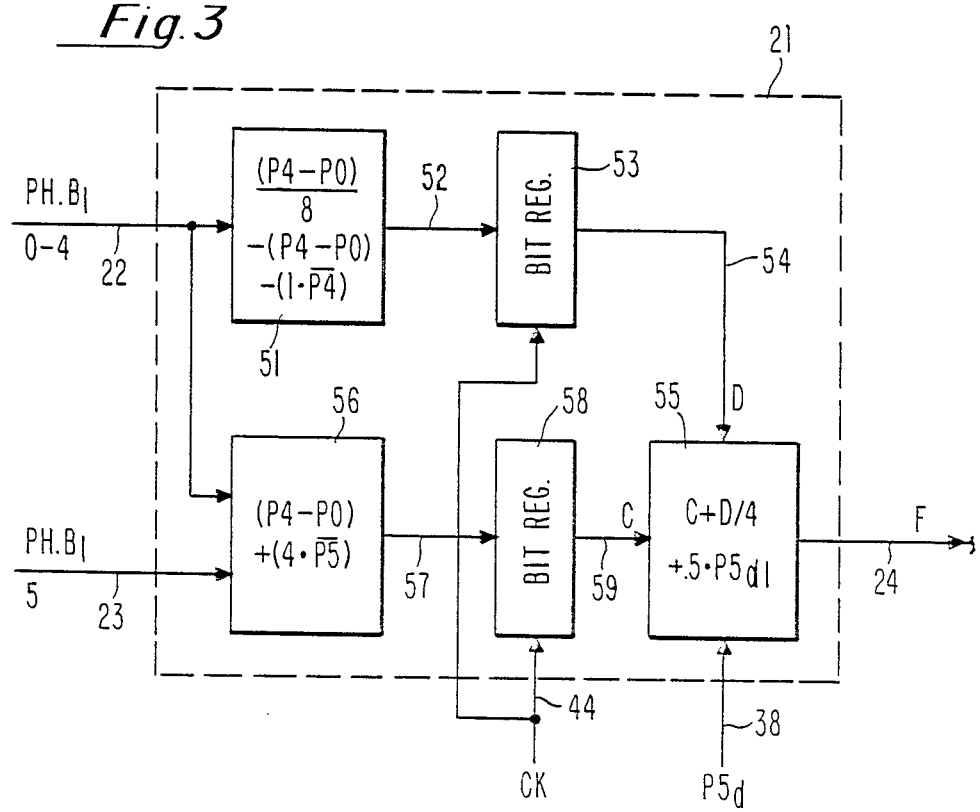
FIG. 3 is a detailed block diagram of a specific phase command map for an 8 bit command used with six plus or minus phase shifters.

Refer now to FIG. 3 showing a detailed block diagram of a specific phase command map employed in the phase shifter of FIG. 2. The phase command bits on line 22 are shown as comprising zero through four phase command bits which are applied to a gating logic block 51 that performs the functions shown inside of the block and produces a five bit output on line 52 which is stored in buffer register 53 as a result of the 5 bit input on line 22. The information in buffer register 53 is clocked out on lines 54 as an input to logic block 55 which performs the logic function shown inside of the block to produce a 5 bit output on line 24 as shown in FIG. 2. Other inputs to the logic block 55 are produced by logic block 56 which produces the logic functions shown inside of the block 56 and provides a five bit output on line 57 which is stored in buffer register 58 until clocked out by clock 44 to produce an output on line 59 which is applied to the logic block 55 to produce the aforementioned output on line 24. The sign is determined by the sign bit on input line 38. While the plus and minus logical computations shown inside of phase command map 21 are specifically designed for controlling the signs of the six plus or minus phase shifters 32 through 37, it will be understood that a phase command map similar to logic block 21 is capable of performing or mapping the sign bits for other numbers of plus or minus phase shifters. FIG. 3 is only an illustration of the preferred embodiment and other embodiments employ the same mode of operation.

Refer now to FIG. 4 showing a detailed block diagram of a general purpose quadrature phase shifter having the aforementioned complex number in parallel form entered on lines 48 and 49. The inphase component on line 48 is applied to a plurality of exclusion OR circuits in block 61 to produce a parallel output on lines 62 having as many bits as the inphase input on line 48. The phase command bits on lines 46 are applied to the single exclusive OR circuit 63 to produce an output on line 64 which is applied to the plurality of exclusive OR circuits (one for each input bit) shown in block 62. The parallel output on line 62 is applied to the multiplexer 65 to produce one of two inputs on output line 66 which is stored in the buffer register 67. The imaginary or quadrature input on line 49 is applied to a plurality of exclusive OR circuits in block 68 (one exclusive OR for each input bit) to produce a parallel output on lines 69 which is applied to MUX 71 and MUX 65 both of which perform a selection operation to produce a single parallel output on their output lines. MUX 71 produces an output on line 72 which is stored in buffer register 73 until clocked out by the clock output on line 44. The preferred quadrature shifter 47 is for general purpose because it can be implemented by adding additional exclusive OR circuits in logic blocks 61 and 68 for each additional bit added to the complex numbers $I_0+jQ_0$.

Refer now to FIG. 5 showing a truth table for the quadrature phase shifter of FIG. 4. The high and low signals for the phase command bits P6 and P7 on lines 46 are shown which produce the different combination of imaginary ($I_1$) and quadrature ($Q_1$) outputs from the logic circuit of FIG. 4.

Figures 6, 7:
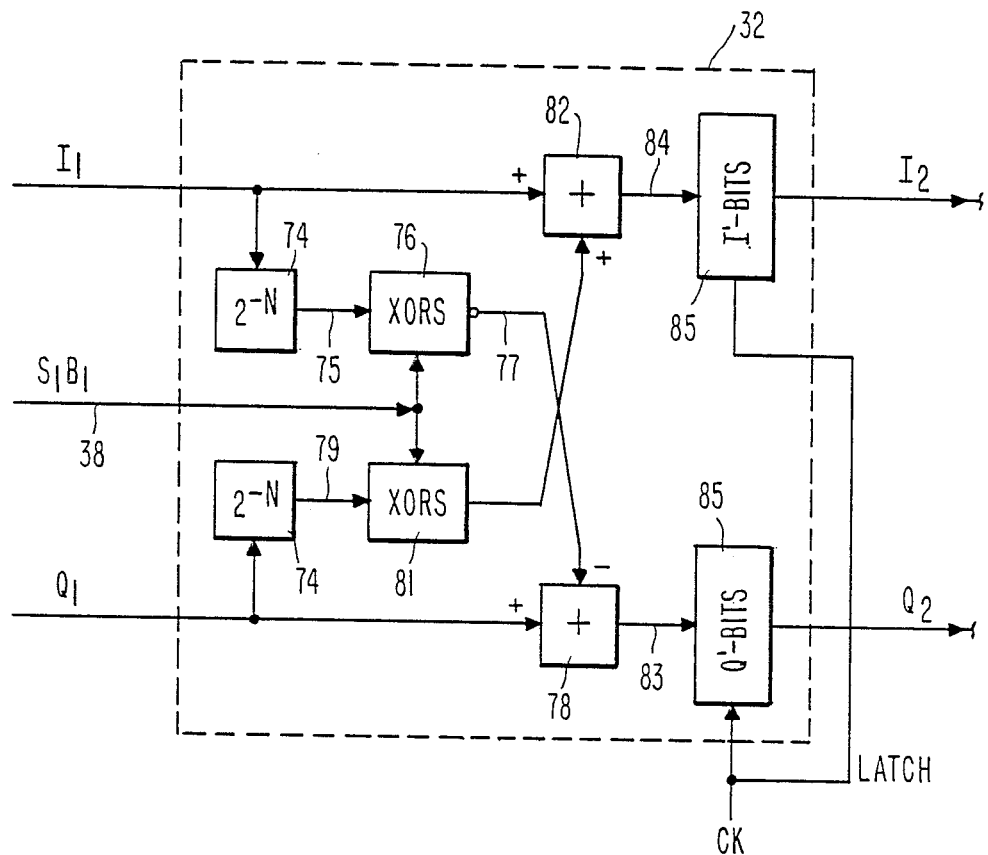
FIG. 6 is a detailed block diagram of a general purpose plus or minus phase shifter of the type employed in FIG. 2.
FIG. 7 is a truth table for a plus or minus phase shifter of the type shown in FIG. 6.

Refer now to FIG. 6 showing a detailed block diagram of a general purpose plus or minus phase shifter of the type employed in FIG. 2. The block illustrated is the first phase shifter 32 having complex numbers $I_1$ and $Q_1$ applied at the input with the sign bit on line 38. Because this is the first of the six phase shifter shown in series, phase shifter 32 employs a logic block $2^{-N}$ where N is equal to one. The $2^{-N}$ logic block in the sixth plus or minus phase shifter 37 would employ a $2^{-6}$ logic block. Logic block 74 represent that the data on lines $I_1$ and $Q_1$ is shifted to the right N number of positions with the sign extended. The output on line 75 is applied to a plurality of exclusive ORs (one for each input bit) shown in logic block 76 to produce an inverted output on line 77 which is supplied to adder 78. Similarly, the output on line 79 is applied to the block of exclusive ORs 81 (one for each input bit) to produce a positive output to adder 82. The outputs from adders 78 and 82 are applied via lines 83 and 84 to the buffer registers 85 and 86 to produce the inphase and quadrature outputs shown as $I_2$ and $Q_2$. It will be understood that the inputs to plus or minus phase shifter 37 will be the $I_6$ and $Q_6$ inputs from phase shifter 36 and will produce the desired and final stage outputs shown as I' and Q' in the preferred embodiment of the present invention.

Refer now to FIG. 7 showing a truth table for the plus or minus phase shifter of FIG. 6. The sign bits on line 38 entering phase shifter 32 are either a plus or a minus sign indicated by zero or one. The outputs produced on output lines $I_2$ and $Q_2$ are shown as either logic functions comprising magnitudes of I and Q where one of the elements is multiplied by $2^{-N}$, and where the N is one to six depending on whether the operation is performed in phase shifter 32 to 37 respectively.

Having explained a preferred embodiment of the present invention it will be appreciated that the quadrature shifter 47 and each of the plus or minus phase shifters 32 through 37 perform their adding and subtracting operations as hardware logic functions during a single clock time and do not require the more complex operations of multiplication employing accumulators. The multiplication of a number by $2^{-N}$ is not a complicated multiplication but is simply a change in the binary representation of each output bit. For example, the operation shown in FIG. 7 designated as $I+Q\ (2^{-N})$ indicates that Q shifted N places is added to I and is performed in one clock time.

As a further example, the operation of the novel phase shifter 20 shown in FIG. 2 is shown having clock signals 44 applied to each of the buffer registers which are to be shifted by the same clock signal. It will be understood that a sample entering register 17 and 18 is clocked into the second stage 47 at the next clock time as another sample enters the register 17 and 18. Thus, by the eighth clock time, the sample which had entered register 17 and 18 is exiting as a I' and Q' output from the plus or minus phase shifter 37. If it is desired to speed up the operation of the phase shifter it is only necessary to speed up the clock which is only limited by the speed of the logic elements employed in the logic blocks explained hereinbefore. It would be expected that the phase shifter 20 would operate at approximately 200 megahertz when implemented in gallium arsinide.

What I claim is:

1. A digital phase shifter comprising:
    a phase command register for receiving phase commands in the form of a digital number,
    an inphase register and a quadrature register for receiving real and imaginary components of a complex number representative of base band data,
    a quadrature shifter coupled to said inphase and quadrature registers and to said phase command register for shifting the phase of said real and imaginary components,
    command map means coupled to said phase command register for receiving a phase command and for generating a plurality of plus and minus phase shift command bits,
    a plurality of plus or minus phase shifters coupled to said plus or minus phase shift command bits and to the output of said quadrature shifter, and
    said plurality of plus or minus phase shifters being connected in series to perform plus or minus phase shifts of predetermined angles that diminish by a factor of approximately one-half from the previous phase shift angle.

2. A digital phase shifter as set forth in claim 1 wherein said quadrature shifter comprises a plurality of exclusive OR circuits, one for each inphase and quadrature bit to be shifted.

3. A digital phase shifter as set forth in claim 1 wherein said plus or minus phase shifters each comprise a plurality of exclusive OR circuits, one for each inphase and quadrature bit to be shifted.

4. A digital phase shifter as set forth in claim 1 wherein each in phase and quadrature binary number of said complex number is divided by $2^N$ by shifting the binary number to the right an N number of places.

5. A digital phase shifter as set forth in claim 4 wherein the multiplication of Q times $2^{-N}$ and I times $2^{-N}$ is accomplished by shifting the binary number to the right to the end number of places.

6. A digital phase shifter as set forth in claim 3 wherein said plus or minus phase shifter shifts the complex number input by a number of degrees equal $\pm$ arc tan $(N^{\frac{1}{2}})$ where N is the number of the plurality of plus or minus phase shifters connected in series.

7. A digital phase shifter as set forth in claim 6 where N is greater than 5.

8. A digital phase shifter as set forth in claim 6 where N is 6 to 8.

* * * * *